(12) United States Patent
Tsukao et al.

(10) Patent No.: US 10,849,236 B2
(45) Date of Patent: Nov. 24, 2020

(54) ANISOTROPIC CONDUCTIVE FILM AND PRODUCTION METHOD OF THE SAME

(71) Applicant: DEXERIALS CORPORATION, Tokyo (JP)

(72) Inventors: Reiji Tsukao, Utsunomiya (JP); Yasushi Akutsu, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 652 days.

(21) Appl. No.: 15/114,664

(22) PCT Filed: Feb. 3, 2015

(86) PCT No.: PCT/JP2015/052927
§ 371 (c)(1),
(2) Date: Jul. 27, 2016

(87) PCT Pub. No.: WO2015/119095
PCT Pub. Date: Aug. 13, 2015

(65) Prior Publication Data
US 2016/0345442 A1    Nov. 24, 2016

(30) Foreign Application Priority Data

Feb. 4, 2014 (JP) .................................. 2014-019867

(51) Int. Cl.
*H05K 3/32* (2006.01)
*H01L 23/00* (2006.01)
(Continued)

(52) U.S. Cl.
CPC .............. *H05K 3/323* (2013.01); *C08L 63/00* (2013.01); *C09D 171/12* (2013.01); *C09J 4/00* (2013.01);
(Continued)

(58) Field of Classification Search
CPC ..... C09D 171/12; C09J 201/00; C09J 163/00; C09J 11/00; C09J 4/00; C08L 63/00;
(Continued)

(56) References Cited

U.S. PATENT DOCUMENTS

2004/0144037 A1* 7/2004 Carter ................. B24D 3/28
51/298
2007/0146887 A1* 6/2007 Ikeda ................... G02B 1/111
359/586
2010/0285305 A1* 11/2010 Akutsu .................. H01L 24/83
428/323

FOREIGN PATENT DOCUMENTS

JP     2001-052778 A    2/2001
JP     2009-030060 A    2/2009
(Continued)

OTHER PUBLICATIONS

Nakayama et al., JP 201349466, Anisotropic conductive material, connection structure and method for producing connection structure, Aug. 1, 2013 (Machine translation) (Year: 2013).*
(Continued)

*Primary Examiner* — Cheng Yuan Huang
(74) *Attorney, Agent, or Firm* — Oliff PLC

(57) ABSTRACT

An anisotropic conductive film having a multilayer structure having conductive particles arranged in a single layer has a first connection layer and a second connection layer formed on a surface of the first connection layer. The first connection layer is a photopolymerized resin layer, and the second connection layer is a thermally or photo-cationically, anionically, or radically polymerizable resin layer. On the surface of the first connection layer on a side of the second connection layer, the conductive particles for anisotropic conductive connection are arranged in a single layer, and the first connection layer contains an insulating filler.

14 Claims, 7 Drawing Sheets

(51) Int. Cl.
    *C09D 171/12*     (2006.01)
    *C09J 11/00*     (2006.01)
    *C09J 4/00*     (2006.01)
    *C08L 63/00*     (2006.01)
    *C09J 163/00*     (2006.01)
    *C09J 201/00*     (2006.01)

(52) U.S. Cl.
    CPC .............. *C09J 11/00* (2013.01); *C09J 163/00* (2013.01); *C09J 201/00* (2013.01); *H01L 24/27* (2013.01); *H01L 24/29* (2013.01); *H01L 24/81* (2013.01); *H01L 24/83* (2013.01); *H01L 24/92* (2013.01); *H01L 24/32* (2013.01); *H01L 2224/271* (2013.01); *H01L 2224/2712* (2013.01); *H01L 2224/27515* (2013.01); *H01L 2224/293* (2013.01); *H01L 2224/294* (2013.01); *H01L 2224/2929* (2013.01); *H01L 2224/2939* (2013.01); *H01L 2224/29082* (2013.01); *H01L 2224/29083* (2013.01); *H01L 2224/29339* (2013.01); *H01L 2224/29344* (2013.01); *H01L 2224/29347* (2013.01); *H01L 2224/29355* (2013.01); *H01L 2224/29357* (2013.01); *H01L 2224/29364* (2013.01); *H01L 2224/29387* (2013.01); *H01L 2224/29444* (2013.01); *H01L 2224/32225* (2013.01); *H01L 2224/32227* (2013.01); *H01L 2224/73204* (2013.01); *H01L 2224/81903* (2013.01); *H01L 2224/83203* (2013.01); *H01L 2224/83851* (2013.01); *H01L 2224/9211* (2013.01); *H01L 2924/0665* (2013.01)

(58) Field of Classification Search
    CPC ......... H05K 3/323; H01L 24/27; H01L 24/29; H01L 2224/29357; H01L 2224/29355; H01L 2224/29444; H01L 2224/29364; H01L 2924/0665; H01L 2224/32225; H01L 2224/27515; H01L 2224/29082; H01L 2224/2929; H01L 2224/29339; H01L 2224/29344; H01L 2224/29347; H01L 2224/73204

See application file for complete search history.

(56) References Cited

FOREIGN PATENT DOCUMENTS

| | | |
|---|---|---|
| JP | 2010-033793 A | 2/2010 |
| JP | 2010-199087 A | 9/2010 |
| JP | 4789738 B2 | 10/2011 |
| JP | 2013-058412 A | 3/2013 |
| JP | 2013-105636 A | 5/2013 |
| JP | 2013-149466 A | 8/2013 |
| TW | 201322276 A1 | 6/2013 |
| WO | 2009/004902 A1 | 1/2009 |

OTHER PUBLICATIONS

Apr. 4, 2018 Office Action issued in Chinese Patent Application No. 201580007299.6.
May 25, 2018 Office Action issued in Taiwanese Patent Application No. 104103696.
Jan. 16, 2019 Office Action issued in Chinese Application No. 201580007299.6.
Aug. 29, 2017 Office Action issued in Japanese Patent Application No. 2014-019867.
May 12, 2015 Written Opinion issued in International Patent Application No. PCT/JP2015/052927.
Feb. 23, 2016 International Preliminary Report on Patentability issued in International Patent Application No. PCT/JP2015/052927.
May 12, 2015 International Search Report issued in International Patent Application No. PCT/JP2015/052927.
Aug. 2, 2019 Office Action issued in Chinese Patent Application No. 201580007299.6.

* cited by examiner

ANISOTROPIC CONDUCTIVE FILM AND PRODUCTION METHOD OF THE SAME

TECHNICAL FIELD

The present invention relates to an anisotropic conductive film and a production method of the same.

BACKGROUND ART

An anisotropic conductive film has been widely used in mounting of electronic components such as an IC chip. In recent years, an anisotropic conductive film having a two-layer structure in which conductive particles for anisotropic conductive connection are arranged in a single layer on an insulating adhesion layer has been proposed (Patent Literature 1), in order to improve the conduction reliability and the insulating properties, increase the mounting conductive particle capture ratio, and decrease the production cost from the viewpoints of application to high-density mounting.

This anisotropic conductive film having a two-layer structure is produced as follows. Conductive particles are arranged in a single layer and a close-packed state on a transfer layer, and then the transfer layer is biaxially stretched to form the transfer layer in which the conductive particles are uniformly arranged at predetermined intervals. After that, the conductive particles on the transfer layer are transferred into an insulating resin layer containing a thermosetting resin and a polymerization initiator, and another insulating resin layer containing a thermosetting resin and no polymerization initiator is laminated on the transferred conductive particles (Patent Literature 1).

CITATION LIST

Patent Literature

Patent Literature 1: Japanese Patent No. 4789738

SUMMARY OF INVENTION

Technical Problem

However, the insulating resin layer containing no polymerization initiator is used for the anisotropic conductive film having a two-layer structure in Patent Literature 1. Therefore, a comparatively large resin flow tends to occur in the insulating resin layer containing no polymerization initiator by heating during anisotropic conductive connection even with the conductive particles being uniformly arranged in a single layer at predetermined intervals. Along the resin flow, the conductive particles also tend to flow. Accordingly, there are problems of a decrease in mounting conductive particle capture ratio, and conduction reliability.

An object of the present invention is to solve the problems in the conventional techniques, and to achieve favorable conduction reliability and favorable mounting conductive particle capture ratio in an anisotropic conductive film having a multilayer structure having conductive particles arranged in a single layer.

Solution to Problem

The present inventors have found that an anisotropic conductive film obtained by adding an insulating filler to a photopolymerizable resin layer, arranging conductive particles in a single layer on the photopolymerizable resin layer, irradiating the photopolymerizable resin layer with ultraviolet light to fix or temporarily fix the conductive particles, and further layering a thermally or photo-cationically, anionically, or radically polymerizable resin layer on the fixed or temporarily fixed conductive particles has a configuration that can achieve the object of the present invention. The present invention has thus been completed.

Specifically, the present invention provides an anisotropic conductive film having a first connection layer and a second connection layer formed on a surface of the first connection layer, wherein the first connection layer is a photopolymerized resin layer, the second connection layer is a thermally or photo-cationically, anionically, or radically polymerizable resin layer, conductive particles for anisotropic conductive connection are arranged in a single layer on the surface of the first connection layer on a side of the second connection layer, and the first connection layer contains an insulating filler.

It is preferable that the second connection layer be a thermally polymerizable resin layer using a thermal polymerization initiator that initiates a polymerization reaction by heating. The second connection layer may be a photopolymerizable resin layer using a photopolymerization initiator that initiates a polymerization reaction by light. The second connection layer may be a thermally and photo-polymerizable resin layer using a thermal polymerization initiator and a photopolymerization initiator in combination. Herein, the second connection layer may be restricted to a thermally polymerizable resin layer using a thermal polymerization initiator in terms of production.

The anisotropic conductive film of the present invention may have a third connection layer that has substantially the same configuration as that of the second connection layer on another surface of the first connection layer to prevent a warping of a bonded body due to stress relaxation or the like. Specifically, the anisotropic conductive film may have the third connection layer that includes a thermally or photo-cationically, anionically, or radically polymerizable resin layer on the other surface of the first connection layer.

It is preferable that the third connection layer be a thermally polymerizable resin layer using a thermal polymerization initiator that initiates a polymerization reaction by heating. The third connection layer may be a photopolymerizable resin layer using a photopolymerization initiator that initiates a polymerization reaction by light. The third connection layer may be a thermally and photo-polymerizable resin layer using a thermal polymerization initiator and a photopolymerization initiator in combination. Herein, the third connection layer may be restricted to a thermally polymerizable resin layer using a thermal polymerization initiator in terms of production.

The present invention provides a production method of the anisotropic conductive film including the following steps (A) to (C) of forming the first connection layer by a photopolymerization reaction in a single step, or the following steps (AA) to (DD) of forming the first connection layer by a photopolymerization reaction in two steps.

(When First Connection Layer is formed by Photopolymerization Reaction in Single Step)

Step (A)

a step of arranging conductive particles in a single layer on a photopolymerizable resin layer containing an insulating filler;

Step (B)

a step of irradiating the photopolymerizable resin layer having the arranged conductive particles with ultraviolet light to cause a photopolymerization reaction, to thereby form the first connection layer in which the conductive particles are fixed in a surface thereof; and Step (C)

a step of forming the second connection layer that includes a thermally or photo-cationically, anionically, or radically polymerizable resin layer on the surface of the first connection layer on a side of the conductive particles.

(When First Connection Layer is Formed by Photopolymerization Reaction in Two Steps)

Step (AA)

a step of arranging conductive particles in a single layer on a photopolymerizable resin layer containing an insulating filler;

Step (BB)

a step of irradiating the photopolymerizable resin layer having the arranged conductive particles with ultraviolet light to cause a photopolymerization reaction, to thereby form a first temporary connection layer in which the conductive particles are temporarily fixed on a surface;

Step (CC)

a step of forming the second connection layer that includes a thermally cationically, anionically, or radically polymerizable resin layer on the surface of the first temporary connection layer on a side of the conductive particles; and Step (DD)

a step of irradiating the first temporary connection layer with ultraviolet light from a side opposite to the second connection layer to cause a photopolymerization reaction, to fully cure the first temporary connection layer to form the first connection layer.

An initiator used in the formation of the second connection layer in the step (CC) is restricted to a thermal polymerization initiator in order not to adversely affect the product life of the anisotropic conductive film, connection, and the stability of a connection structure. Specifically, when the first connection layer is irradiated with ultraviolet light in two steps, the second connection layer may be restricted to a material to be cured by thermal polymerization in terms of restriction of the step. When the irradiation in two steps is continuously performed, the second connection layer can be formed at the same step as the single step. Therefore, the same function effect can be expected.

The present invention provides a production method of the anisotropic conductive film having the third connection layer having the same configuration as that of the second connection layer on the other surface of the first connection layer, the production method having the following step (Z) after the step (C) in addition to the steps (A) to (C), or having the following step (Z) after the step (DD) in addition to the steps (AA) to (DD).

Step (Z)

A step of forming the third connection layer that includes a thermally or photo-cationically, anionically, or radically polymerizable resin layer on the surface of the first connection layer opposite to the conductive particles.

Further, the present invention provides a production method of the anisotropic conductive film having the third connection layer having substantially the same configuration as that of the second connection layer on the other surface of the first connection layer, the production method having the following step (a) before the step (A) in addition to the steps (A) to (C), or having the following step (a) before the step (AA) in addition to the steps (AA) to (DD).

Step (a)

A step of forming the third connection layer that includes a thermally or photo-cationically, anionically, or radically polymerizable resin layer on a surface of a photopolymerizable resin layer containing an insulating filler.

In the step (A) or (AA) in the production method having this step (a), the conductive particles may be arranged in a single layer on another surface of the photopolymerizable resin layer.

When the third connection layer is provided in such a step, it is preferable that the polymerization initiator be restricted to an initiator that acts by a thermal reaction because of the above-described reason. However, when the second and third connection layers containing a photopolymerization initiator are provided by a method that does not adversely affect the product life and connection after the formation of the first connection layer, the production of the anisotropic conductive film containing the photopolymerization initiator in accordance with the main object of the present invention is not particularly restricted.

The present invention also encompasses an aspect in which the second or third connection layer of the present invention functions as a tacky layer.

The present invention further provides a connection structure in which a first electronic component and a second electronic component are connected by anisotropic conductive connection through the aforementioned anisotropic conductive film.

Advantageous Effects of Invention

The anisotropic conductive film of the present invention has the first connection layer that is a photopolymerized resin layer obtained by photopolymerizing a photopolymerizable resin layer containing an insulating filler, and the second connection layer that includes a thermally or photo-cationically, anionically, or radically polymerizable resin layer formed on a surface of the first connection layer. In addition, the conductive particles for anisotropic conductive connection are arranged in a single layer on the surface of the first connection layer on a side of the second connection layer. Further, the insulating filler is added to the first connection layer. Therefore, the conductive particles can be firmly fixed in the first connection layer. Therefore, favorable conduction reliability and favorable mounting conductive particle capture ratio can be achieved. In the photopolymerizable resin layer under (on the back side of) the conductive particles in the first connection layer, the irradiation dose of ultraviolet light can be made relatively low due to the presence of the conductive particles to decrease the curing ratio. For this reason, favorable pushing properties can be achieved.

When bonding is caused by heat, the bonding is achieved by the same method as a connection method using a general anisotropic conductive film. When bonding is caused by light, pushing by a connection tool may be performed before a reaction is completed. Even in this case, the connection tool or the like is often heated to promote resin flow and pushing of particles. Even when heat and light are used in combination, bonding may be achieved in the same manner as described above.

In a case of anisotropic conductive connection using a photoreaction, light irradiation from a side of light transmission part is performed.

This irradiation may be inhibited by a wiring. However, in the present invention, the width of the wiring is decreased (that is, a pitch is decreased), but an effect on anisotropic conductive connection is expressed. Therefore, even if the present invention includes an aspect that includes a photoreactive compound capable of withstanding connection, there is not a contradiction.

DESCRIPTION OF EMBODIMENTS

<<Anisotropic Conductive Film>>

Hereinafter, a preferable example of the anisotropic conductive film of the present invention will be described in detail.

Figure 1:
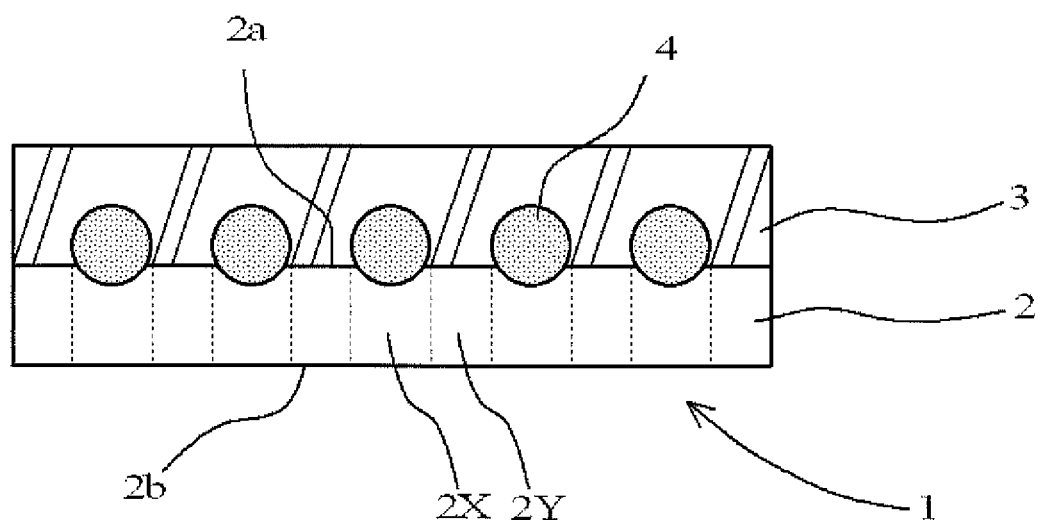
FIG. 1 is a cross-sectional view of an anisotropic conductive film of the present invention.

As shown in FIG. 1, an anisotropic conductive film 1 of the present invention has a structure in which a second connection layer 3 that includes a thermally or photo-cationically, anionically, or radically polymerizable resin layer is formed on a surface of a first connection layer 2 that includes a photopolymerized resin layer obtained by photopolymerizing a photopolymerizable resin layer containing an insulating filler. On a surface 2a of the first connection layer 2 on a side of the second connection layer 3, conductive particles 4 are arranged in a single layer, and preferably uniformly arranged for anisotropic conductive connection.

The expression uniformly herein means a state where the conductive particles are arranged in a plane direction. This regularity may be defined as constant intervals. Further, the insulating filler is added to the first connection layer 2.

<First Connection Layer 2>

The first connection layer 2 constituting the anisotropic conductive film 1 of the present invention is a photopolymerized resin layer obtained by photopolymerizing a photopolymerizable resin layer containing the insulating filler. Therefore, the conductive particles can be fixed. Because of polymerization, the resin is unlikely to flow even under heating during anisotropic conductive connection. Therefore, the occurrence of short circuit can be largely suppressed. Accordingly, the conduction reliability can be improved, and the mounting particle capture ratio can be improved. It is particularly preferable that the first connection layer 2 be a photo-radically polymerized resin layer obtained by photo-radically polymerizing a photo-radically polymerizable resin layer containing an acrylate compound, a photo-radical polymerization initiator, and the insulating filler. Hereinafter, a case where the first connection layer 2 is a photo-radically polymerized resin layer will be described.

(Insulating Filler)

The insulating filler is particularly used to improve the conduction reliability of the first connection layer 2. The average particle diameter of such an insulating filler is preferably 5 nm or more and 500 nm or less, and more preferably 7 nm or more and 300 nm or less. When the average particle diameter falls within this range, the conduction reliability can be improved, and the mounting conductive particle capture ratio can also be improved. It is preferable that the insulating filler have light scattering properties to promote sufficient light curing of the first connection layer 2 as a whole. Herein, the light scattering properties mean properties in which outside light is diffused within the layer. Specific examples of the insulating filler may include silica fine particles and rutile type titanium oxide.

The content of the insulating filler in the first connection layer 2 is preferably 0.5 to 20% by mass, and more preferably 2 to 7% by mass. When the content falls within this range, the conduction reliability can be improved, and the mounting conductive particle capture ratio can also be improved without impairing pushing of the conductive particles.

(Acrylate Compound)

As an acrylate compound that is an acrylate unit, a conventionally known photo-radically polymerizable acrylate can be used. For example, a monofunctional (meth) acrylate (herein, (meth)acrylate includes acrylate and methacrylate), or a multifunctional (meth)acrylate having two or more functional groups can be used. In the present invention, in order to make an adhesive thermosettable, it is preferable that a multifunctional (meth)acrylate be used in at least a portion of acrylic monomers.

When the content of the acrylate compound in the first connection layer 2 is too small, a difference in viscosity between the first connection layer 2 and the second connection layer 3 is unlikely to be generated. When the content thereof is too large, the curing shrinkage increases and the workability tends to decrease. Therefore, the content thereof is preferably 2 to 70% by mass, and more preferably 10 to 50% by mass.

(Photo-Radical Polymerization Initiator)

As the photo-radical polymerization initiator, a publicly known photo-radical polymerization initiator can be appropriately selected and used. Examples of the publicly known photo-radical polymerization initiator may include an acetophenone-based photopolymerization initiator, a benzylketal-based photopolymerization initiator, and a phosphorus-based photopolymerization initiator.

When the amount of the photo-radical polymerization initiator to be used is too small relative to 100 parts by mass of the acrylate compound, photo-radical polymerization does not sufficiently proceed. When the amount is too large, stiffness may decrease. Therefore, the amount is preferably 0.1 to 25 parts by mass, and more preferably 0.5 to 15 parts by mass.

(Conductive Particles)

As the conductive particles, conductive particles used in conventionally known anisotropic conductive films can be appropriately selected and used. Examples of the conductive particles may include metal particles such as nickel, cobalt, silver, copper, gold, and palladium particles, and metal-coated resin particles. Two or more kinds thereof may be used in combination.

When the average particle diameter of the conductive particles is too small, the variation of heights of wirings cannot be absorbed, and the resistance tends to increase. When the average particle diameter is too large, short circuit tends to occur. Therefore, the average particle diameter is preferably 1 to 10 μm, and more preferably 2 to 6 μm.

When the amount of such conductive particles in the first connection layer 2 is too small, the capture number of mounting conductive particles decreases, and the anisotropic conductive connection is difficult. When the amount is too large, short circuit may occur. Therefore, the amount is preferably 50 to 50,000, and more preferably 200 to 30,000 per square millimeter.

In the first connection layer 2, if necessary, a film-forming resin such as a phenoxy resin, an epoxy resin, an unsaturated polyester resin, a saturated polyester resin, a urethane resin, a butadiene resin, a polyimide resin, a polyamide resin, and a polyolefin resin can also be used in combination. In the second connection layer 3 and the third connection layer 5, the film-forming resin may also be used in combination similarly.

When the thickness of the first connection layer 2 is too small, the mounting conductive particle capture ratio tends to decrease. When the thickness is too large, the conduction resistance tends to increase. Therefore, the thickness is preferably 1.0 to 6.0 μm, and more preferably 2.0 to 5.0 μm.

The first connection layer 2 may further contain an epoxy compound and a thermal or photo-cationic or anionic polymerization initiator. In this case, it is preferable that the second connection layer 3 be also a thermally or photo-cationically or anionically polymerizable resin layer containing an epoxy compound and a thermal or photo-cationic or anionic polymerization initiator, as described below. Thus, the delamination strength can be improved. The epoxy compound and the thermal or photo-cationic or anionic polymerization initiator will be described in the second connection layer 3.

In the first connection layer 2, it is preferable that the conductive particles 4 eat into the second connection layer 3 (i.e., the conductive particles 4 be exposed to the surface of the first connection layer 2), as shown FIG. 1. This is because the connection resistance may be increased when all the conductive particles 4 are embedded in the first connection layer 2. When a degree of eating-into is too small, the mounting conductive particle capture ratio tends to decrease. When the degree is too large, the conduction resistance tends to increase. Therefore, the degree is preferably 10 to 90%, and more preferably 20 to 80% of the average particle diameter of the conductive particles.

When the photo-radically polymerizable resin layer is irradiated with ultraviolet light to form the first connection layer 2, any of a surface where the conductive particles are not disposed and a surface where the conductive particles are disposed may be irradiated. When the surface where the conductive particles are disposed is irradiated with ultraviolet light, the curing ratio of a first connection layer portion 2X in a region between the conductive particles 4 and an outermost surface 2b of the first connection layer 2 in the first connection layer 2 can be made lower than that of a first connection layer portion 2Y in a region between the adjacent conductive particles 4. Thus, the first connection layer portion 2X is likely to be eliminated during thermocompression-bonding of anisotropic conductive connection. Thus the conduction reliability is expected to be improved. The curing ratio herein represents a value defined as a decrease ratio of a vinyl group. The curing ratio of the first connection layer portion 2X is preferably 40 to 80%, and the curing ratio of the first connection layer portion 2Y is preferably 70 to 100%.

When the insulating filler has favorable light scattering properties or light diffusing properties, the curing ratio of the first connection layer portion 2X tends to be improved as compared with a case where the insulating filler is not contained. It is preferable that the difference in curing ratio between the first connection layer portion 2X and the first connection layer portion 2Y be less than 10%.

The difference in curing ratio between the first connection layer portions 2X and 2Y may not substantially exist. This is because the fixation of the conductive particles can proceed and stable quality can be secured in the production. This is because pressures applied to the arranged conductive particles at a winding start and a winding end are made uniform in elongating a product in a general manner, and disordered arrangement is prevented.

Photo-radical polymerization for formation of the first connection layer 2 may be performed in a single step (that is, by one irradiation with light), or in two steps (that is, by two-times irradiations with light). In this case, it is preferable that the second connection layer 3 be formed on the surface of the first connection layer 2 and another surface of the first connection layer 2 be then irradiated with light at the second step under an oxygen-containing atmosphere (in the air). As a result, a radical polymerization reaction is inhibited by oxygen to increase the surface concentration of an uncured component. Thus, an effect capable of improving the tackiness can be expected. Curing in two steps makes the polymerization reaction complex. Therefore, detailed control of fluidity of the resin and the particles can be expected.

In the first connection layer portion 2X in such photo-radical polymerization in two steps, the curing ratio at the first step is preferably 10 to 50%, and the curing ratio at the second step is preferably 40 to 80%. In the first connection layer portion 2Y, the curing ratio at the first step is preferably 30 to 90%, and the curing ratio at the second step is preferably 70 to 100%.

In the photo-radical polymerization in two steps, when the insulating filler has favorable light diffusing properties, the curing ratio of the first connection layer portion 2X tends to be improved as compared with a case where the insulating filler is not contained. It is preferable that the difference in curing ratio between the first connection layer portions 2X and 2Y be less than 10%.

When a photo-radical polymerization reaction for formation of the first connection layer 2 is performed in two steps, only one kind of a radical polymerization initiator may be used. It is preferable, however, that two kinds of photo-radical polymerization initiators having different wavelength ranges that initiate a radical reaction be used in order to improve the stickiness. For example, it is preferable that IRGACURE 369 (BASF Japan Ltd.) that initiates a radical reaction by light having a wavelength of 365 nm from an LED light source and IRGACURE 2959 (BASF Japan Ltd.) that initiates a radical reaction by light from a light source of a high pressure mercury lamp be used in combination. When the two kinds of different photo-radical polymerization initiators are used, bonding of the resin is complicated. As a result, a behavior of thermal flow of the resin during connection can be finely controlled. This is because a force in a thickness direction tends to be applied to the particles and the flow of the particles in a plane direction is suppressed during pushing during anisotropic conductive connection. The effects of the present invention tend to be expressed.

The lowest melt viscosity of the first connection layer 2 measured by a rheometer is higher than that of the second connection layer 3. Specifically, a value of [the lowest melt viscosity of the first connection layer 2 (mPa·s)]/[the lowest melt viscosity of the second connection layer 3 (mPa·s)] is preferably 1 to 1,000, and more preferably 4 to 400. Among the lowest melt viscosities, the lowest melt viscosity of the former is preferably 100 to 100,000 mPa·s, and more preferably 500 to 50,000 mPa·s. The lowest melt viscosity of the latter is preferably 0.1 to 10,000 mPa·s, and more preferably 0.5 to 1,000 mPa·s.

The first connection layer 2 can be formed by attaching the conductive particles to the photo-radically polymerizable resin layer containing a photo-radically polymerizable acrylate and a photo-radical polymerization initiator by a procedure such as a film transfer method, a mold transfer method, an inkjet method, and an electrostatic attachment method and irradiating the photo-radically polymerizable resin layer with ultraviolet light from a side of the conductive particles, an opposite side thereof, or both the sides. It is preferable that the photo-radically polymerizable resin layer be irradiated with ultraviolet light from only the conductive particle side since the curing ratio of the first connection layer portion 2X can be relatively decreased.

<Second Connection Layer 3>

The second connection layer 3 includes a thermally or photo-cationically, anionically, or radically polymerizable resin layer, and preferably includes a thermally or photo-cationically or anionically polymerizable resin layer containing an epoxy compound and a thermal or photo-cationic or anionic polymerization initiator, or a thermally or photo-radically polymerizable resin layer containing an acrylate compound and a thermal or photo-radical polymerization initiator. Herein, it is preferable that the second connection layer 3 be formed from the thermally polymerizable resin layer in terms of convenience of production and quality stability since a polymerization reaction does not occur in the second connection layer 3 by irradiation with ultraviolet light for formation of the first connection layer 2.

When the second connection layer 3 is the thermally or photo-cationically or anionically polymerizable resin layer, the second connection layer 3 may further contain an acrylate compound and a thermal or photo-radical polymerization initiator. Thus, the delamination strength from the first connection layer 2 can be improved.

(Epoxy Compound)

When the second connection layer 3 is the thermally or photo-cationically or anionically polymerizable resin layer containing an epoxy compound and a thermal or photo-cationic or anionic polymerization initiator, examples of the epoxy compound may include a compound or a resin having two or more epoxy groups in the molecule. The compound and the resin may be liquid or solid.

(Thermal Cationic Polymerization Initiator)

As the thermal cationic polymerization initiator, a publicly known thermal cationic polymerization initiator for an epoxy compound can be used. For example, the thermal cationic polymerization initiator generates an acid, which can cationically polymerize a cationically polymerizable compound, by heat. A publicly known iodonium salt, sulfonium salt, phosphonium salt, or ferrocenes can be used. An aromatic sulfonium salt that exhibits favorable latency for temperature can be preferably used.

When the amount of the thermal cationic polymerization initiator to be added is too small, curing tends to be difficult. When the amount is too large, the product life tends to be reduced. Therefore, the amount is preferably 2 to 60 parts by mass, and more preferably 5 to 40 parts by mass, relative to 100 parts by mass of the epoxy compound.

(Thermal Anionic Polymerization Initiator)

As the thermal anionic polymerization initiator, a publicly known thermal anionic polymerization initiator for an epoxy compound can be used. For example, the thermal anionic polymerization initiator generates a base, which can anionically polymerize an anionically polymerizable compound, by heat. A publicly known aliphatic amine-based compound, aromatic amine-based compound, secondary or tertiary amine-based compound, imidazole-based compound, polymercaptan-based compound, boron trifluoride-amine complex, dicyandiamide, or organic acid hydrazide can be used. An encapsulated imidazole-based compound that exhibits favorable latency for temperature can be preferably used.

When the amount of the thermal anionic polymerization initiator to be added is too small, curing tends to be difficult. When the amount is too large, the product life tends to be reduced. Therefore, the amount is preferably 2 to 60 parts by mass, and more preferably 5 to 40 parts by mass, relative to 100 parts by mass of the epoxy compound.

(Photo-Cationic Polymerization Initiator and Photo-Anionic Polymerization Initiator)

As the photo-cationic polymerization initiator or the photo-anionic polymerization initiator for an epoxy compound, a publicly known polymerization initiator can be appropriately used.

(Acrylate Compound)

When the second connection layer 3 is the thermally or photo-radically polymerizable resin layer containing an acrylate compound and a thermal or photo-radical polymerization initiator, the acrylate compound described in relation to the first connection layer 2 can be appropriately selected and used.

(Thermal Radical Polymerization Initiator)

Examples of the thermal radical polymerization initiator may include an organic peroxide and an azo-based compound. An organic peroxide that does not generate nitrogen causing bubbles can be preferably used.

When the amount of the thermal radical polymerization initiator to be used is too small, curing is difficult. When the amount is too large, the product life is reduced. Therefore, the amount is preferably 2 to 60 parts by mass, and more preferably 5 to 40 parts by mass, relative to 100 parts by mass of the acrylate compound.

(Photo-Radical Polymerization Initiator)

As the photo-radical polymerization initiator for an acrylate compound, a publicly known photo-radical polymerization initiator can be used When the amount of the photo-radical polymerization initiator to be used is too small, curing is difficult. When the amount is too large, the product life is reduced. Therefore, the amount is preferably 2 to 60 parts by mass, and more preferably 5 to 40 parts by mass, relative to 100 parts by mass of the acrylate compound.

(Third Connection Layer 5)

Figure 5:
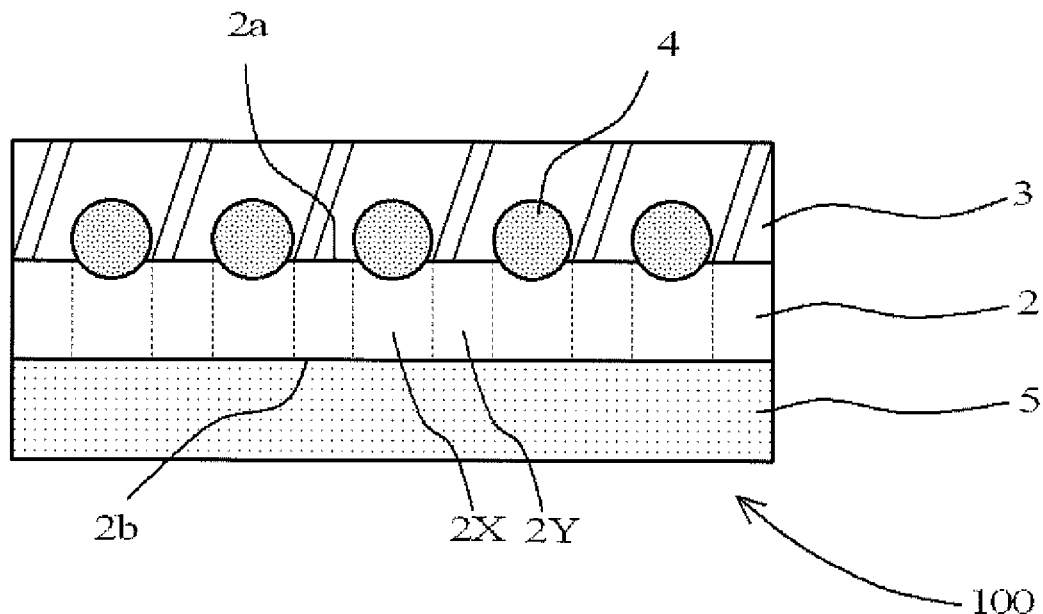
FIG. 5 is a cross-sectional view of an anisotropic conductive film of the present invention.

The anisotropic conductive film having a two-layer structure in FIG. 1 is described above. As shown in FIG. 5, a third connection layer 5 may be formed on another surface of the first connection layer 2. Thus, an effect capable of finely controlling the fluidity of the whole layer can be obtained. Herein, the third connection layer 5 may have the same configuration as that of the second connection layer 3. Specifically, the third connection layer 5 includes a thermally or photo-cationically or anionically or radically polymerizable resin layer like the second connection layer 3. After the second connection layer is formed on a surface of the first connection layer, such a third connection layer 5 may be formed on another surface of the first connection layer. Alternatively, before formation of the second connection layer, the third connection layer may be formed in advance on another surface (where the second connection layer is not formed) of the first connection layer or the photopolymerizable resin layer as a precursor.

<<Production Method of Anisotropic Conductive Film>>

The production method of the anisotropic conductive film of the present invention includes a production method that performs a photopolymerization reaction in a single step and a production method that performs a photopolymerization reaction in two steps.

<Production Method that Performs Photopolymerization Reaction in Single Step>

One example in which the anisotropic conductive film of FIG. 1 (FIG. 4B) is produced by photo-polymerization in a single step will be described. This production example includes the following steps (A) to (C).

(Step (A))

Figure 2:
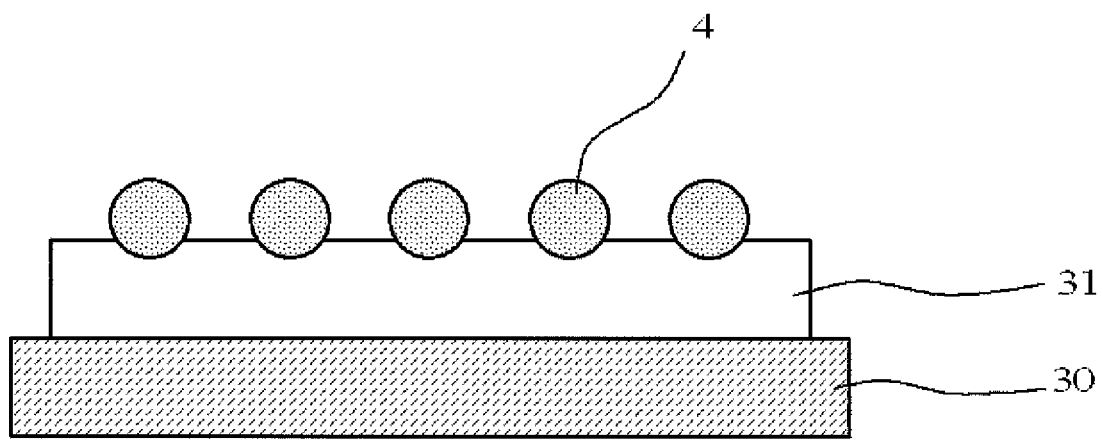
FIG. 2 is an explanatory diagram of a production step (A) of the anisotropic conductive film of the present invention.

As shown in FIG. 2, the conductive particles 4 are arranged in a single layer on a photopolymerizable resin layer 31 that contains an insulating filler and is formed on a release film 30, if necessary. A procedure of arranging the conductive particles 4 is not particularly limited. A method using a biaxial stretching operation for an unstretched polypropylene film in Example 1 of Japanese Patent No. 4789738, a method using a mold in Japanese Patent Application Laid-Open No. 2010-33793, or other methods may be used. For the degree of arrangement, the size, conduction reliability, insulating properties, and mounting conductive particle capture ratio of a connection subject are taken in account. The conductive particles are preferably arranged so as to be two-dimensionally apart about 1 to about 100 µm from each other.

(Step (B))

Figure 3A:
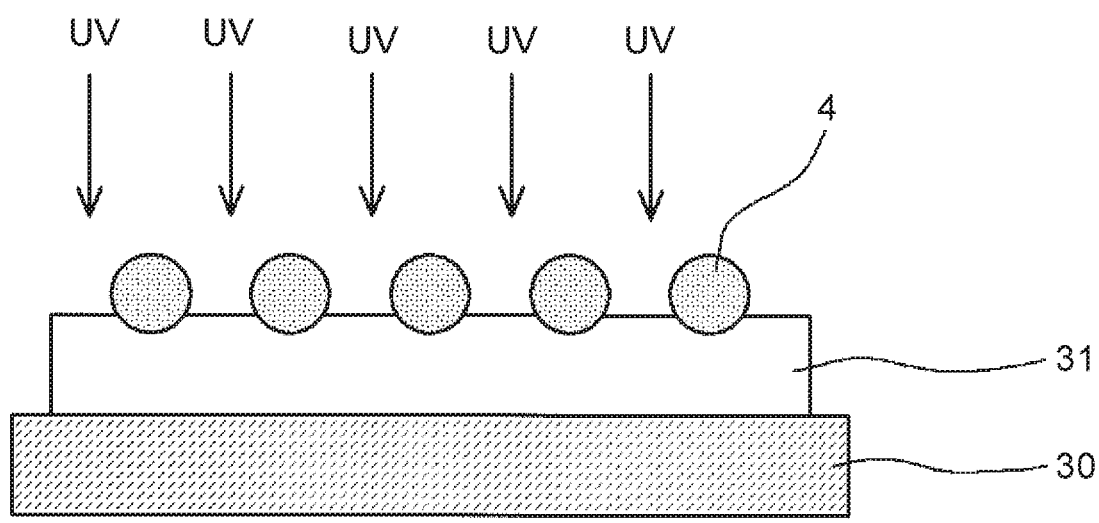
FIG. 3A is an explanatory diagram of a production step (B) of the anisotropic conductive film of the present invention.
Figure 3B:
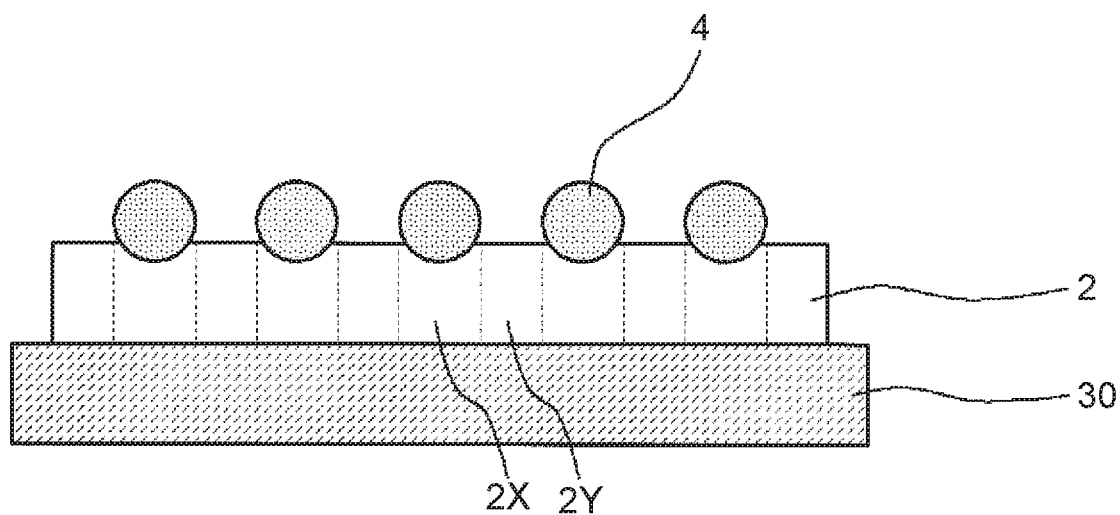
FIG. 3B is an explanatory diagram of the production step (B) of the anisotropic conductive film of the present invention.

As shown in FIG. 3A, the photopolymerizable resin layer 31 having the arranged conductive particles 4 is irradiated with ultraviolet light (UV) to cause a photopolymerization reaction, so that the first connection layer 2 in which the conductive particles 4 are fixed in the surface is formed. In this case, the photopolymerizable resin layer may be irradiated with ultraviolet light (UV) from the side of the conductive particles, or from the opposite side. When the photopolymerizable resin layer is irradiated with ultraviolet light (UV) from the side of the conductive particles, the curing ratio of the first connection layer portion 2X in a region between the conductive particles 4 and the outermost surface of the first connection layer 2 can be made lower than that of the first connection layer portion 2Y in a region between adjacent conductive particles 4, as shown in FIG. 3B. Thus, the curing properties of back side of the particles are surely reduced to facilitate pushing during bonding. In addition, an effect of preventing the flow of the particles can also be obtained.

(Step (C))

Figure 4A:
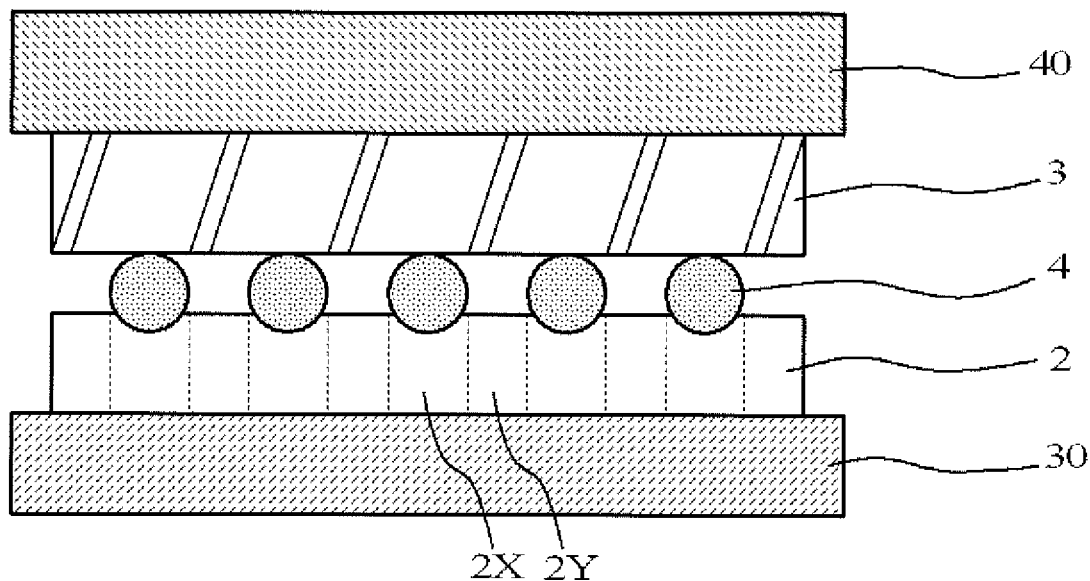
FIG. 4A is an explanatory diagram of a production step (C) of the anisotropic conductive film of the present invention.
Figure 4B:
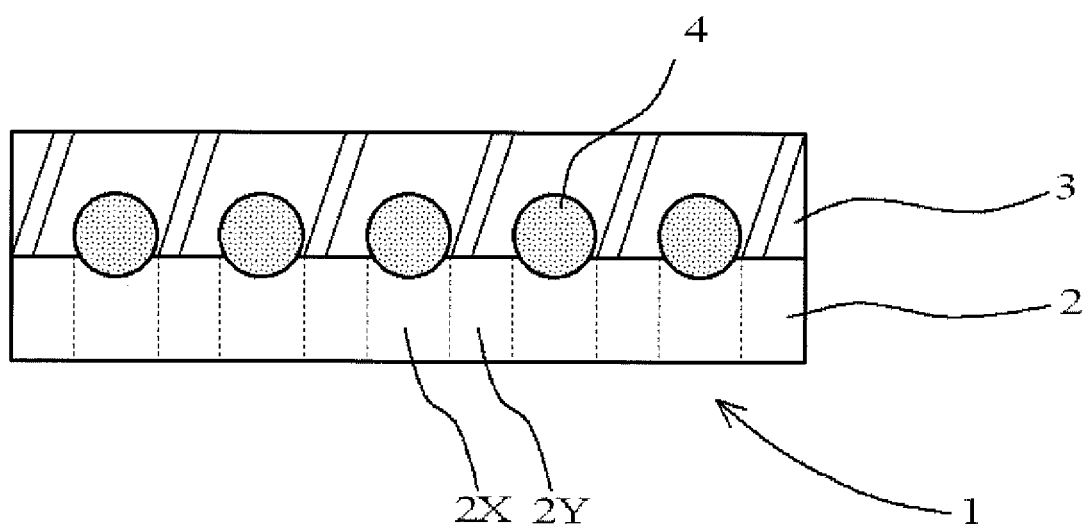
FIG. 4B is an explanatory diagram of the production step (C) of the anisotropic conductive film of the present invention.

As shown in FIG. 4A, the second connection layer 3 that includes a thermally or photo-cationically, anionically, or radically polymerizable resin layer is formed on a surface of the first connection layer 2 on a side of the conductive particles 4. Specifically, the second connection layer 3 formed by an ordinary method on a release film 40 is placed on the surface of the first connection layer 2 on the side of the conductive particles 4 and thermocompression-bonding is performed so as not to cause excess thermal polymerization. The release films 30 and 40 are removed. Thus, an anisotropic conductive film of FIG. 4B can be obtained.

An anisotropic conductive film 100 of FIG. 5 can be obtained by performing the following step (Z) after the step (C).

(Step (Z))

The third connection layer that includes a thermally or photo-cationically, anionically, or radically polymerizable resin layer is formed on a surface of the first connection layer opposite to the conductive particles, preferably like the second connection layer. Thus, the anisotropic conductive film of FIG. 5 can be obtained.

The anisotropic conductive film 100 of FIG. 5 can be obtained by performing the following step (a) before the step (A) without performing the step (Z).

(Step (a))

This step is a step of forming the third connection layer that includes a thermally or photo-cationically, anionically, or radically polymerizable resin layer on a surface of the photopolymerizable resin layer containing an insulating filler. After this step (a), the anisotropic conductive film 100 of FIG. 5 can be obtained by performing the steps (A), (B), and (C). At the step (A), however, the conductive particles are arranged in a single layer on another surface of the photopolymerizable resin layer.

(Production Method that Performs Photopolymerization Reaction in Two Steps)

One example in which the anisotropic conductive film of FIG. 1 (FIG. 4B) is produced by photo-polymerization in two steps will be described. This production example includes the following steps (AA) to (DD).

(Step (AA))

Figure 6:
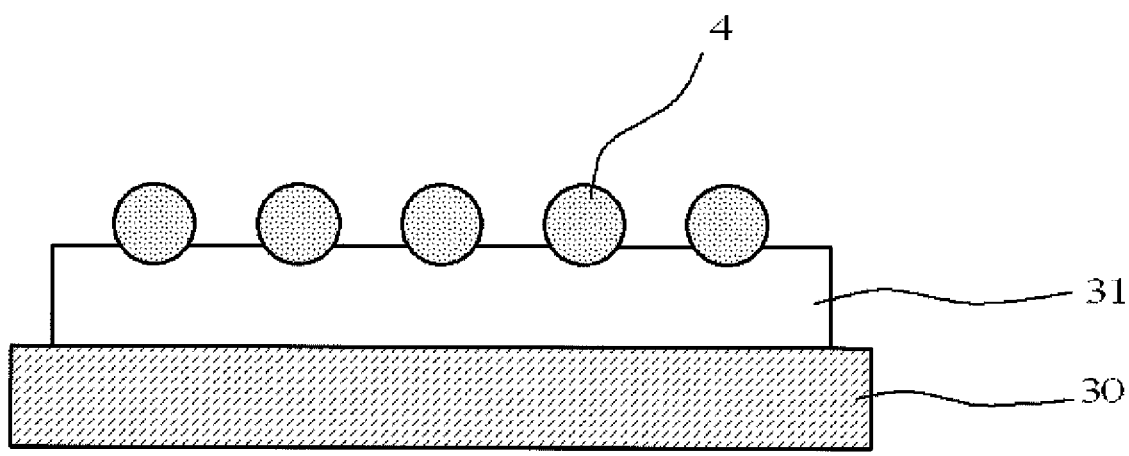
FIG. 6 is an explanatory diagram of a production step (AA) of the anisotropic conductive film of the present invention.

As shown in FIG. 6, the conductive particles 4 are arranged in a single layer on the photopolymerizable resin layer 31 that contains an insulating filler and is formed on the release film 30, if necessary. A procedure of arranging the conductive particles 4 is not particularly limited. The method using a biaxial stretching operation for an unstretched polypropylene film in Example 1 of Japanese Patent No. 4789738, the method using a mold in Japanese Patent Application Laid-Open No. 2010-33793, or other methods may be used. For the degree of arrangement, the size, conduction reliability, insulating properties, and mounting conductive particle capture ratio of a connection subject are taken in account. The conductive particles are preferably arranged so as to be two-dimensionally apart about 1 to about 100 µm from each other.

(Step (BB))

Figure 7A:
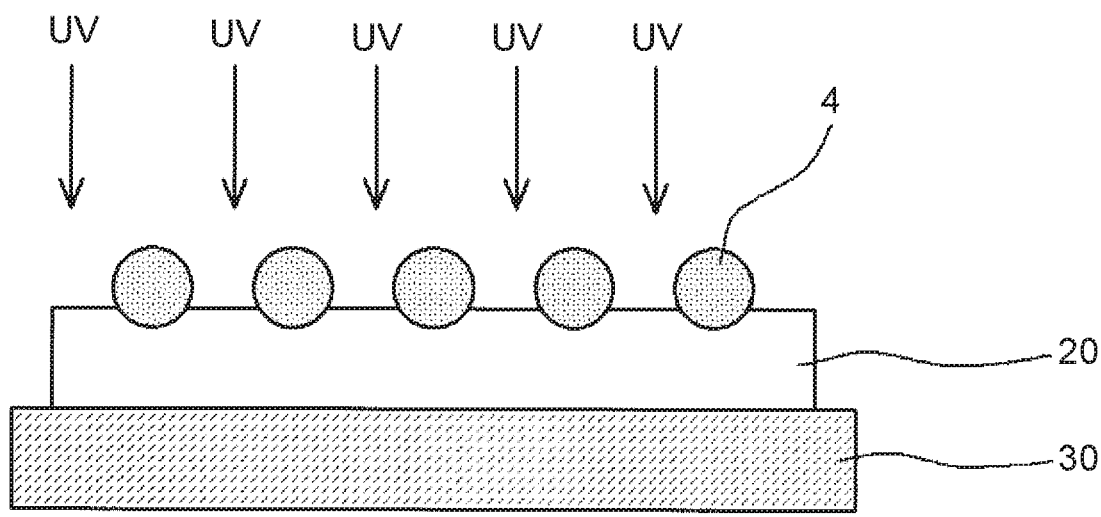
FIG. 7A is an explanatory diagram of a production step (BB) of the anisotropic conductive film of the present invention.
Figure 7B:
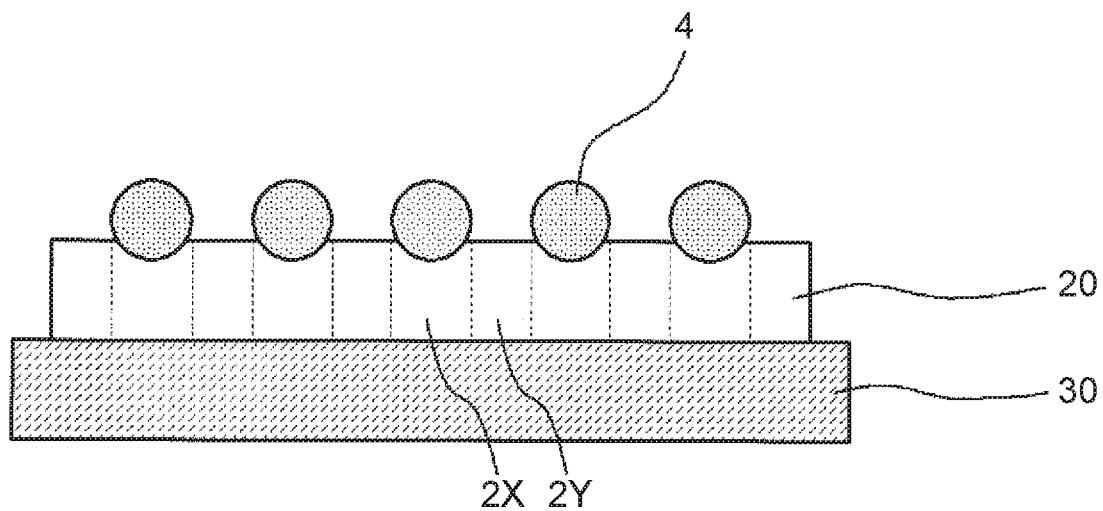
FIG. 7B is an explanatory diagram of the production step (BB) of the anisotropic conductive film of the present invention.

As shown in FIG. 7A, the photopolymerizable resin layer 31 having the arranged conductive particles 4 is irradiated with ultraviolet light (UV) to cause a photopolymerization reaction, so that a first temporary connection layer 20 in which the conductive particles 4 are temporarily fixed on the surface is formed. In this case, the photopolymerizable resin layer may be irradiated with ultraviolet light (UV) from the side of the conductive particles, or from the opposite side. When the photopolymerizable resin layer is irradiated with ultraviolet light (UV) from the side of the conductive particles, the curing ratio of the first connection layer portion 2X in a region between the conductive particles 4 and the outermost surface of the first temporary connection layer 20 can be made lower than that of the first connection layer portion 2Y in a region between the adjacent conductive particles 4, as shown in FIG. 7B.

(Step (CC))

Figure 8A:
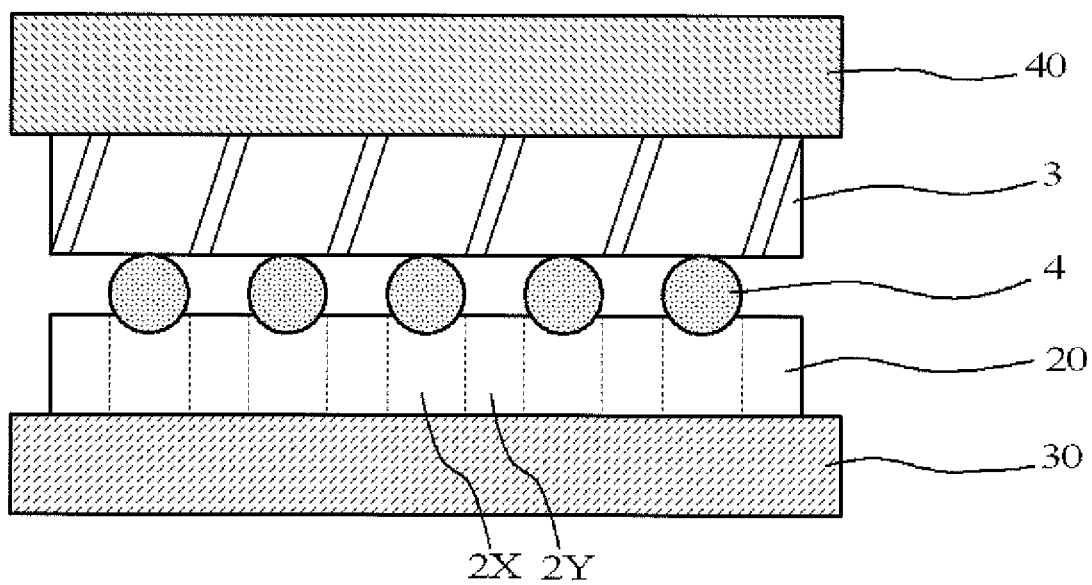
FIG. 8A is an explanatory diagram of a production step (CC) of the anisotropic conductive film of the present invention.
Figure 8B:
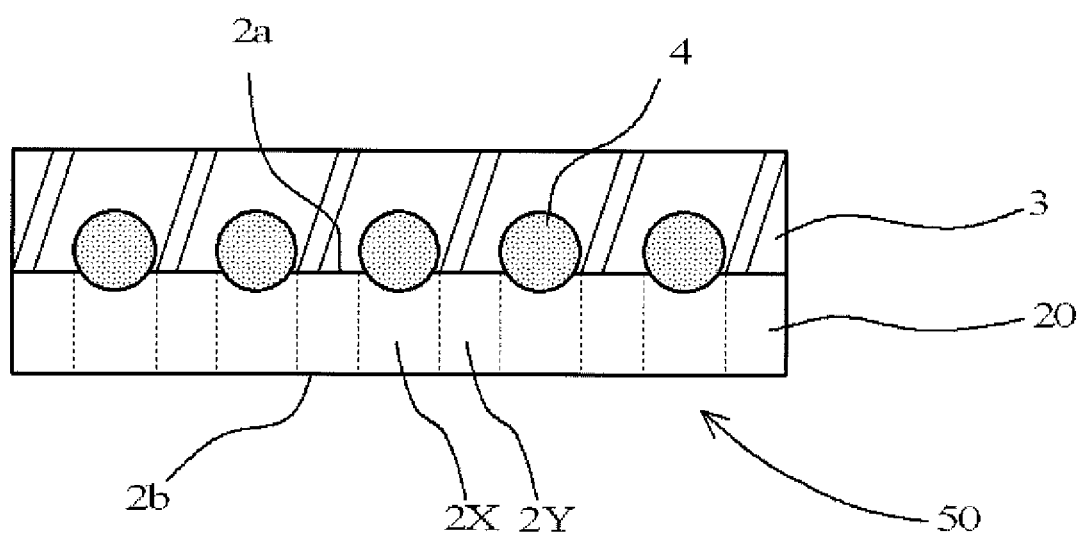
FIG. 8B is an explanatory diagram of the production step (CC) of the anisotropic conductive film of the present invention.

As shown in FIG. 8A, the second connection layer 3 that includes a thermally-cationically, anionically, or radically polymerizable resin layer is formed on a surface of the first temporary connection layer 20 on a side of the conductive particles 4. Specifically, the second connection layer 3 formed by an ordinary method on the release film 40 is placed on the surface of the first connection layer 2 on the side of the conductive particles 4 and thermocompression-bonding is performed so as not to cause excess thermal polymerization. The release films 30 and 40 are removed. Thus, a temporary anisotropic conductive film 50 of FIG. 8B can be obtained.

(Step (DD))

Figure 9A:
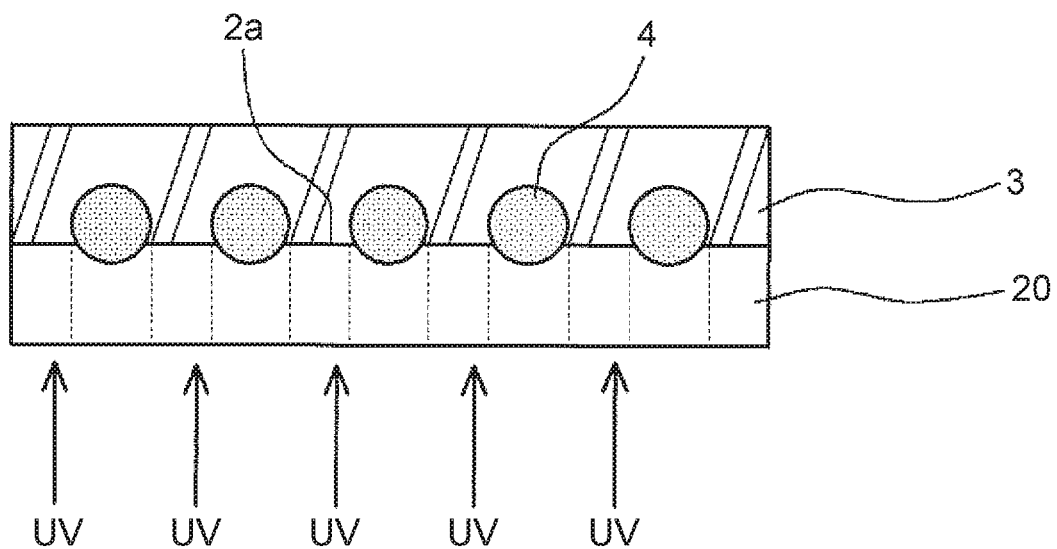
FIG. 9A is an explanatory diagram of a production step (DD) of the anisotropic conductive film of the present invention.
Figure 9B:
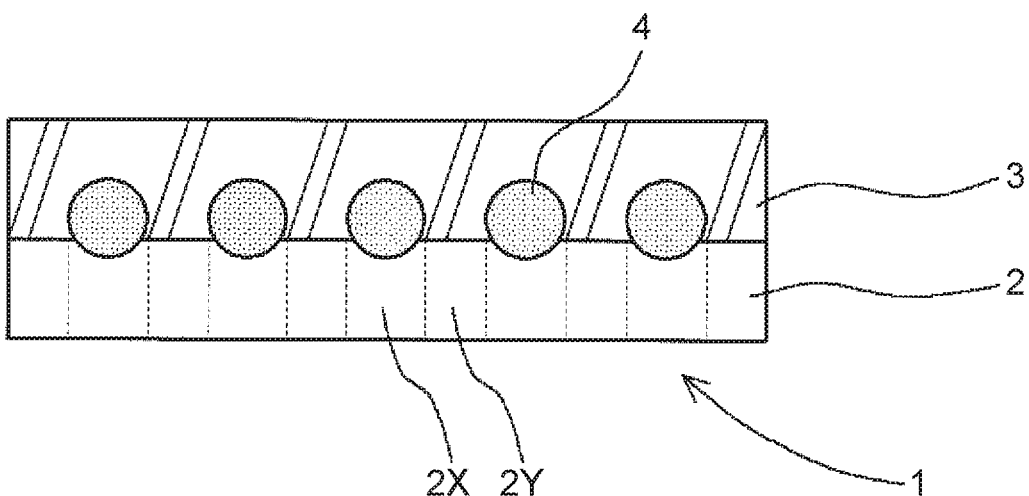
FIG. 9B is an explanatory diagram of the production step (DD) of the anisotropic conductive film of the present invention.

As shown in FIG. 9A, the first temporary connection layer 20 is irradiated with ultraviolet light from the side opposite to the second connection layer 3 to cause a photopolymerization reaction, so that the first temporary connection layer 20 is fully cured to form the first connection layer 2. Thus, an anisotropic conductive film 1 of FIG. 9B can be obtained. At this step, it is preferable that the first temporary connection layer 20 be irradiated with ultraviolet light in a direction perpendicular to the first temporary connection layer 20. In order not to eliminate a difference in curing ratio between the first connection layer portions 2X and 2Y, it is preferable that irradiation be performed through a mask or a difference in amount of irradiated light be produced by an irradiated portion.

When the photo-polymerization is caused in two steps, the anisotropic conductive film 100 of FIG. 5 can be obtained by performing the following step (Z) after the step (DD).

(Step (Z))

The third connection layer that includes a thermally or photo-cationically, anionically, or radically polymerizable resin layer is formed on a surface of the first connection layer opposite to the conductive particles, preferably like the second connection layer. Thus, the anisotropic conductive film of FIG. 5 can be obtained.

The anisotropic conductive film 100 of FIG. 5 can be obtained by performing the following step (a) before the step (AA) without performing the step (Z).

(Step (a))

This step is a step of forming a thermally or photo-cationically, anionically, or radically polymerizable resin layer on a surface of the photopolymerizable resin layer containing the insulating filler. The anisotropic conductive film 100 of FIG. 5 can be obtained by performing the steps (AA) to (DD) after this step (a). At the step (AA), however, the conductive particles are arranged in a single layer on another surface of the photopolymerizable resin layer. In this case, it is preferable that the polymerization initiator used for formation of the second connection layer be a thermal polymerization initiator. Use of a photopolymerization initiator may affect the product life of the anisotropic conductive film, connection, and the stability of a connection structure in terms of the steps.

<<Connection Structure>>

The anisotropic conductive film thus obtained can be preferably applied to anisotropic conductive connection between a first electronic component such as an IC chip and an IC module and a second electronic component such as a flexible substrate and a glass substrate. The resultant connection structure is also a part of the present invention. It is preferable that a surface of the anisotropic conductive film on the side of the first connection layer be disposed on a side of the second electronic component such as a flexible substrate and a surface of the anisotropic conductive film on the side of the second connection layer be disposed on a side of the first electronic component such as an IC chip since the conduction reliability is enhanced.

EXAMPLES

Hereinafter, the present invention will be described specifically by Examples.

Examples 1 to 10 and Comparative Example 1

Conductive particles were arranged in accordance with an operation of Example 1 of Japanese Patent No. 4789738, and an anisotropic conductive film having a two-layer structure in which first and second connection layers were layered in accordance with a composition (parts by mass) of Table 1 was produced.

(First Connection Layer)

Specifically, an acrylate compound, a photo-radical polymerization initiator, an insulating filler, and the like were mixed in ethyl acetate or toluene to prepare a mixed liquid having a solid content of 50% by mass. This mixed liquid was applied to a polyethylene terephthalate film having a thickness of 50 μm so as to have a dried thickness of 5 μm, and dried in an oven at 80° C. for 5 minutes, to form a photo-radically polymerizable resin layer that was a precursor of the first connection layer.

Conductive particles (Ni/Au-plated resin particles, AUL 704, available from SEKISUI CHEMICAL CO., LTD.) having an average particle diameter of 4 μm were arranged at intervals of 4 μm in a single layer on the obtained photo-radically polymerizable resin layer. The photo-radically polymerizable resin layer was irradiated with ultraviolet light having a wavelength of 365 nm and an integrated light amount of 4,000 mJ/cm$^2$ from the conductive particle side. Thus, the first connection layer in which the conductive particles were fixed in the surface was formed. In Examples 6 to 10, the photo-radical polymerizable resin layer was irradiated with ultraviolet light at an integrated light amount of 200 mJ/cm$^2$.

(Second Connection Layer)

A thermosetting resin, a latent curing agent, and the like were mixed in ethyl acetate or toluene to prepare a mixed liquid having a solid content of 50% by mass. This mixed liquid was applied to a polyethylene terephthalate film having a thickness of 50 μm so as to have a dried thickness of 12 μm, and dried in an oven at 80° C. for 5 minutes, to form the second connection layer.

(Anisotropic Conductive Film)

The thus obtained first and second connection layers were laminated so that the conductive particles were located inside, to obtain the anisotropic conductive film.

The anisotropic conductive films of Examples 6 to 10 were each further irradiated with ultraviolet light having a wavelength of 365 nm from a side of the first connection layer at an integrated light amount of 2,000 mJ/cm$^2$.

(Connection Structure Sample)

An IC chip having a size of 0.5×1.8×20.0 mm (bump size: 30×85 μm bump height: 15 μm bump pitch: 50 μm) was mounted on a glass wiring substrate (1737F) having a size of 0.5×50×30 mm available from Corning Incorporated using the obtained anisotropic conductive film under conditions of 180° C., 80 MPa, and 5 seconds to obtain a connection structure sample.

(Test Evaluation)

As described below, "mounting conductive particle capture ratio," "initial conduction resistance", and "conduction reliability" of the anisotropic conductive films in the obtained connection structure samples were tested and evaluated. The obtained results are shown in Table 1.

"Mounting Conductive Particle Capture Ratio"

The ratio of the "amount of particles actually captured on the bump of the connection structure sample after heating and pressurization (after actual mounting)" to the "theoretical amount of particles existing on the bump of the connection structure sample before heating and pressurization" was determined in accordance with the following mathematical expression.

Mounting Conductive Particle Capture Ratio (%)={[the number of conductive particles on bump after heating and pressurization]/[the number of conductive particles on bump before heating and pressurization]}×100

"Initial Conduction Resistance"

The connection resistance value of each of the connection structure samples was measured by a digital multimeter (Agilent Technologies). In practical terms, the conduction resistance value is desirably 2Ω or less.

"Conduction Reliability"

The connection structure sample was left under a high-temperature and high-humidity environment of 85° C. and 85% RH for 500 hours. The conduction resistance was measured by a digital multimeter (Agilent Technologies). In practical terms, when the conduction resistance is 4Ω or less, the conduction reliability is determined as being favorable.

TABLE 1

| | | | | Example | | | | | |
|---|---|---|---|---|---|---|---|---|---|
| | | | | 1 | 2 | 3 | 4 | 5 | 6 |
| First Connection Layer | Phenoxy Resin | YP-50 | Nippon Steel & Sumikin Chemical Co., Ltd. | 60 | 80 | 60 | 60 | 60 | 60 |
| | Acrylate | EB600 | Daicel-Allnex Ltd. | 40 | 20 | 40 | 40 | 40 | 40 |
| | Photo-Radical Polymerization Initiator | IRGACURE 369 | BASF Japan Ltd. | 2 | 2 | 2 | 2 | 2 | 2 |
| | Thermal Cationic Polymerization Initiator | SI-60L | Sanshin Chemical Industry Co., Ltd. | 2 | 2 | 2 | | 2 | 2 |
| | Slica Fine Particle Average Primary Particle Diameter: 12 μm | Aerosil RY200 | Nippon Aerosil Co., Ltd. | 5 | | | | 5 | |
| | Rutile Type Titanium Oxide Average Particle Diameter: 250 nm | CR-EL | Ishihara Sangyo Kaisha, Ltd. | | | | | | 2 |
| | Rutile Type Titanium Oxide Average Particle Diameter: 180 nm | PR-201 | Ishihara Sangyo Kaisha, Ltd. | | 5 | 2 | 0.5 | 2 | |
| | Conductive Particle Arrangement | AUL704 | Sekisui Chemical Co., Ltd. | | | Uniform | | | |
| Second Connection Layer | Phenoxy Resin | YP-50 | Nippon Steel & Sumikin Chemical Co., Ltd. | 60 | 60 | 60 | 60 | 60 | 60 |
| | Epoxy Resin | jER828 | Mitsubishi Chemical Corporation | 40 | 40 | 40 | 40 | 40 | 40 |
| | Thermal Cationic Polymerization Initiator | SI-60L | Sanshin Chemical Industry Co., Ltd. | 2 | 2 | 2 | 2 | 2 | 2 |
| Surface/Number of UV Irradiation (Surface: Conductive Particle Side, Both Surfaces: Conductive Particle Side and Back Side) | | | | Surface/1 | Surface/1 | Surface/1 | Surface/1 | Surface/1 | Both Surfaces/2 |
| Mounting Conductive Particle Capture Ratio (%) | | | | 86 | 86 | 84 | 82 | 90 | 82 |
| Initial Conduction Resistance (Ω) | | | | 0.2 | 0.2 | 0.2 | 0.2 | 0.2 | 0.2 |
| Conduction Reliability (Ω) | | | | 2.5 | 2.5 | 2.9 | 3.4 | 2.3 | 3.7 |

| | | | | Example | | | | Comparative Example |
|---|---|---|---|---|---|---|---|---|
| | | | | 7 | 8 | 9 | 10 | 1 |
| First Connection Layer | Phenoxy Resin | YP-50 | Nippon Steel & Sumikin Chemical Co., Ltd. | 60 | 60 | 60 | 60 | 60 |
| | Acrylate | EB600 | Daicel-Allnex Ltd. | 40 | 40 | 40 | 40 | 40 |
| | Photo-Radical Polymerization Initiator | IRGACURE 369 | BASF Japan Ltd. | 2 | 2 | 2 | 2 | 2 |
| | Thermal Cationic Polymerization Initiator | SI-60L | Sanshin Chemical Industry Co., Ltd. | 2 | 2 | 2 | 2 | 2 |

TABLE 1-continued

| | | | | | | | | | |
|---|---|---|---|---|---|---|---|---|---|
| | Slica Fine Particle Average Primary Particle Diameter: 12 μm | Aerosil RY200 | Nippon Aerosil Co., Ltd. | | | | | 2 | |
| | Rutile Type Titanium Oxide Average Particle Diameter: 250 nm | CR-EL | Ishihara Sangyo Kaisha, Ltd. | 0.5 | 5 | | | | |
| | Rutile Type Titanium Oxide Average Particle Diameter: 180 nm | PR-201 | Ishihara Sangyo Kaisha, Ltd. | | | | 2 | | |
| | Conductive Particle Arrangement | AUL704 | Sekisui Chemical Co., Ltd. | | | | Uniform | | |
| Second Connection Layer | Phenoxy Resin | YP-50 | Nippon Steel & Sumikin Chemical Co., Ltd. | 60 | 60 | 60 | 60 | 60 | |
| | Epoxy Resin | jER828 | Mitsubishi Chemical Corporation | 40 | 40 | 40 | 40 | 40 | |
| | Thermal Cationic Polymerization Initiator | SI-60L | Sanshin Chemical Industry Co., Ltd. | 2 | 2 | 2 | 2 | 2 | |
| | Surface/Number of UV Irradiation (Surface: Conductive Particle Side, Both Surfaces: Conductive Particle Side and Back Side) | | | Both Surfaces/2 | Both Surfaces/2 | Both Surfaces/2 | Both Surfaces/2 | Surface/1 | |
| | Mounting Conductive Particle Capture Ratio (%) | | | 81 | 83 | 81 | 82 | 80 | |
| | Initial Conduction Resistance (Ω) | | | 0.2 | 0.2 | 0.2 | 0.2 | 0.2 | |
| | Conduction Reliability (Ω) | | | 3.7 | 3.7 | 3.8 | 3.8 | 4 | |

As seen from Table 1, the anisotropic conductive films of Examples 1 to 10 exhibited preferable results in practical terms in all evaluation items of mounting conductive particle capture ratio, initial conduction resistance, and conduction reliability. The mounting conductive particle capture ratio and the conduction reliability were improved as compared with the anisotropic conductive film of Comparative Example 1 where the insulating filler was not added to the first connection layer.

INDUSTRIAL APPLICABILITY

The anisotropic conductive film of the present invention has a two-layer structure in which the first connection layer that is a photopolymerized resin layer and a thermally or photo-cationically, anionically, or radically polymerizable resin layer are layered. In addition, the conductive particles for anisotropic conductive connection are arranged in a single layer on a surface of the first connection layer on a side of the second connection layer. Further, an insulating filler is added to the first connection layer. For this reason, favorable conduction reliability and mounting conductive particle capture ratio are exhibited. Therefore, the anisotropic conductive film is useful in anisotropic conductive connection of an electronic component such as an IC chip to a wiring substrate. The width of the wiring of the electronic component has been decreased. When the present invention contributes to such technical advancement, the effects are particularly exerted.

REFERENCE SIGNS LIST

1, 100 anisotropic conductive film
2 first connection layer
2X, 2Y first connection layer portion
3 second connection layer
4 conductive particle
5 third connection layer
30, 40 release film
20 first temporary connection layer
31 photopolymerizable resin layer
50 temporary anisotropic conductive film

The invention claimed is:

1. An anisotropic conductive film having a first connection layer, a second connection layer formed on a surface of the first connection layer and a third connection layer formed on another surface of the first connection layer, wherein
   the first connection layer is a photopolymerized resin layer,
   the second connection layer is a thermally or photo-cationically, anionically, or radically polymerizable resin layer,
   the third connection layer has the same configuration as that of the second connection layer and is a thermally or photo-cationically, anionically, or radically polymerizable resin layer,
   conductive particles for anisotropic conductive connection are arranged in a single layer on the surface of the first connection layer on a side of the second connection layer, and
   the first connection layer and the third connection layer each contains an insulating filler,
   wherein the insulating filler comprises particles having an average particle diameter of 5 nm or more and 500 nm or less, wherein a lowest melt viscosity of the first connection layer is higher than a lowest melt viscosity of the second connection layer, and
   wherein the conductive particles eat into the second connection layer.

2. The anisotropic conductive film according to claim 1, wherein the first connection layer is a photo-radically polymerized resin layer obtained by photo-radically polymerizing a photo-radically polymerizable resin layer containing an acrylate compound and a photo-radical polymerization initiator.

3. The anisotropic conductive film according to claim 2, wherein the first connection layer further contains an epoxy compound and a thermal or photo-cationic or anionic polymerization initiator.

4. The anisotropic conductive film according to claim 1, wherein the second connection layer is a thermally or photo-cationically or anionically polymerizable resin layer containing an epoxy compound and a thermal or photo-cationic or anionic polymerization initiator or a thermally or photo-radically polymerizable resin layer containing an acrylate compound and a thermal or photo-radical polymerization initiator.

5. The anisotropic conductive film according to claim 1, wherein the second connection layer is a thermally or photo-cationically or anionically polymerizable resin layer containing an epoxy compound and a thermal or photo-cationic or anionic polymerization initiator and further contains an acrylate compound and a thermal or photo-radical polymerization initiator.

6. The anisotropic conductive film according to claim 1, wherein a curing ratio of a first connection layer portion in a region between the conductive particle and an outermost surface of the first connection layer in the first connection layer is lower than a curing ratio of a first connection layer portion in a region between adjacent conductive particles.

7. A connection structure in which a first electronic component and a second electronic component are connected by anisotropic conduction through the anisotropic conductive film according to claim 1.

8. A method of producing a connection structure, comprising connecting a first electronic component and a second electronic component by anisotropic conduction through the anisotropic conductive film according to claim 1.

9. The anisotropic conductive film according to claim 1, wherein the conductive particles are metal particles or metal-coated resin particles.

10. The anisotropic conductive film according to claim 1, wherein the conductive particle includes two or more kinds of conductive particles.

11. The anisotropic conductive film according to claim 1, wherein an average particle diameter of the conductive particles is 1 to 10 μm.

12. The anisotropic conductive film according to claim 1, wherein an amount of the conductive particles are 50 to 50,000 per square millimeter.

13. The anisotropic conductive film according to claim 1, wherein the conductive particles are arranged so as to be two-dimensionally apart about 1 μm to 100 μm from each other.

14. The anisotropic conductive film according to claim 1, wherein a thickness of the first connection layer is 1 μm to 6 μm.

* * * * *